United States Patent
Lee et al.

(10) Patent No.: US 7,312,091 B2
(45) Date of Patent: Dec. 25, 2007

(54) METHODS FOR FORMING A FERROELECTRIC LAYER AND CAPACITOR AND FRAM USING THE SAME

(75) Inventors: Moon-Sook Lee, Seoul (KR); Byoung-Jae Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 124 days.

(21) Appl. No.: 10/898,564

(22) Filed: Jul. 26, 2004

(65) Prior Publication Data
US 2005/0064605 A1    Mar. 24, 2005

Related U.S. Application Data

(63) Continuation-in-part of application No. 10/784,772, filed on Feb. 24, 2004.

(30) Foreign Application Priority Data
Jul. 25, 2003    (KR) ............................ 2003-0051434

(51) Int. Cl.
*H01L 21/00* (2006.01)
(52) U.S. Cl. ............ 438/3; 257/E21.208; 257/E21.664
(58) Field of Classification Search ................... 438/3; 257/E21.208, E21.664
See application file for complete search history.

(56) References Cited

U.S. PATENT DOCUMENTS

| | | | |
|---|---|---|---|
| 6,278,152 B1 * | 8/2001 | Hieda et al. ................. | 257/306 |
| 6,656,748 B2 * | 12/2003 | Hall et al. ..................... | 438/3 |
| 6,825,126 B2 * | 11/2004 | Asai et al. .................. | 438/722 |

* cited by examiner

*Primary Examiner*—Asok Kumar Sarkar
(74) *Attorney, Agent, or Firm*—Harness, Dickey & Pierce, P.L.C.

(57) ABSTRACT

Metal organic chemical vapor deposition (MOCVD) may be utilized in methods of forming an (111) oriented PZT ferroelectric layer at a lower temperature, a ferroelectric capacitor and methods of fabricating, and a ferroelectric memory device using the same may be provided. Using the metal organic chemical vapor deposition, ferroelectric layers, capacitors, and memory devices, which may be fabricated and may have (111) preferred oriented crystal growth.

37 Claims, 14 Drawing Sheets

METHODS FOR FORMING A FERROELECTRIC LAYER AND CAPACITOR AND FRAM USING THE SAME

PRIORITY STATEMENT

This application is a continuation-in-part application of "Apparatus For Fabricating Semiconductor Devices, Heating Arrangement, Shower Head Arrangement, Method of Reducing Thermal Disturbance During Fabrication Of A Semiconductor Device, And Method Of Exchanging Heat During Fabrication Of A Semiconductor Device" by the present inventors, U.S. Ser. No. 10/784,772, filed on Feb. 24, 2004 and a continuation-in-part application of "Method And Apparatus For Forming A Ferroelectric Layer" by the present inventors, U.S. Ser. No. not yet assigned, filed concurrently herewith, the contents of both of which are hereby incorporated by reference in their entirety. This application also claims the benefit under 35 U.S.C. § 119(a) of Korean Patent Application No. 2003-0051434, filed on Jul. 25, 2003, the contents of which are hereby incorporated by reference in their entirety.

FIELD OF THE INVENTION

The present invention relates to a method and apparatus for forming a ferroelectric layer, and more particularly, to a method and apparatus for forming a ferroelectric layer for a ferroelectric random access memory (FRAM) using metal organic chemical vapor deposition (MOCVD).

BACKGROUND OF THE INVENTION

High performance system on chips (SoCs), such as security devices, multi-purpose integrated circuit (IC) card chip and subscriber identification module (SIM), may utilize a non-volatile memory device which may include larger memory density, higher access speed and/or higher reliability. Ferroelectric random access memory (FRAM) devices may satisfy those requirements because the FRAM devices may have advantages of higher access speeds and/or lower power consumption. However, the conventional FRAM devices may not be fabricated such that they may be used in the SoCs.

A ferroelectric memory device which may use a (111) metal organic chemical vapor deposition $Pb(Zr,Ti)O_3$ (MOCVD PZT) as a ferroelectric layer of a capacitor, a recessed iridium (Ir) barrier, and a higher temperature mask etching process may increase the switching charge and/or improve the reliability.

As illustrated in FIG. 1, a ferroelectric capacitor 70 may be formed on a tungsten plug 10. A recessed Ir barrier 20 may be formed to oxidize the tungsten plug 10 and to reduce the height of the capacitor 70. A lower electrode 40 may be formed of iridium (Ir) and MOCVD PZT may be deposited at a higher temperature (for example, 620° C.) to form a (111) oriented ferroelectric layer 50. Iridium oxide (IrOx) may be deposited to form an upper electrode 60, and a higher temperature mask etching process may be performed at a temperature of 400° C. to form the capacitor 70 which may have a higher aspect ratio. An encapsulation layer 30 may be formed and may cover the entire capacitor 70.

The upper electrode 60 may maintain a larger area thereof due to a recessed iridium barrier 20 after the higher temperature mask etching process and the angle of a flank of capacitor 70 may be approximately 70°.

FIG. 1A is a cross-sectional view of the ferroelectric memory device and FIG. 1B is an SEM photograph of a ferroelectric capacitor.

FIG. 2 illustrates X-ray diffraction patterns of MOCVD PZTs formed in a 620° C. process and in a conventional 580° C. process, respectively. As illustrated in FIG. 2, the PZT (marked with a solid line) may be deposited at a temperature of 620° C. using a seeding layer and may have a (111) oriented crystal growth, however the PZT (marked with a dotted line) which may be deposited at a temperature of 580° C. without the seeding layer may have a randomly oriented crystal growth.

Referring to FIG. 3, the PZT grown at 580° C. may have a randomly oriented granular structure, but the PZT grown at 620° C. may have a (111) orientated columnar structure. The PZT with the columnar structure may have improved crystal quality.

In a retention test, as illustrated in FIG. 4, the switching charge on the (111) oriented PZT capacitor (closed circles) may be stable with aging time, and the switching charge on the randomly oriented PZT capacitor (open squares) may decrease. More specifically, as illustrated in FIG. 5, the switching charge on the (111) oriented PZT capacitor (closed circles) may be stable, while the switching charge on the randomly oriented PZT capacitor (open squares) may decrease (for example, to nearly zero).

A recessed Ir barrier may be formed on a tungsten plug and iridium (Ir) may be deposited on the lower electrode. Fabrication of the recessed Ir barrier may be complex because it may utilize an Ir deposition, etching, and/or chemical mechanical polishing (CMP) processes.

As the capacitor area may decrease, which may be a result of an increase of a device integration density, the probability of causing misalignment may increase during photolithographic processes which may be used to form the recessed Ir barrier and the lower electrode.

The (111) oriented PZT may utilize a higher temperature (for example, 620° C.) to be deposited, and therefore the process temperature of the MOCVD may be increased to deposit the PZT, such that structural and/or operational problems may arise due to the higher temperature.

SUMMARY OF THE INVENTION

Exemplary embodiments of the present invention may provide methods of forming a ferroelectric capacitor which may include a (111) oriented PZT ferroelectric layer formed at a lower temperature, and methods of fabricating the ferroelectric memory device (FRAM) using the same.

In exemplary embodiments of the present invention, methods of forming a ferroelectric layer may utilize a metal organic vapor deposition (MOCVD). The MOCVD may include a process chamber for applying an MOCVD process to a substrate; a susceptor for heating the substrate to a reaction temperature of MOCVD; a showerhead; a first gas inflow device which may include a vaporizer and may guide the metal organic precursor gas to a first jet element; and a second gas inflow device which may include a heater and may guide the oxidizer gas to a second jet element. The showerhead may comprise the first jet element for spraying the metal organic precursor gas and the carrier gas, which may be in a heated state into the process chamber; and the second jet element for spraying the oxidizer gas, which may be in a heated state, into the process chamber. The showerhead may suppress a pre-mixing of the heated metal organic precursor gas and the heated oxidizer gas before passing the first and second jet elements.

In exemplary embodiments of the present invention, a distance between the showerhead 520 and the wafer 100 may be controllable to improve the uniformity of the resulting layer which may be at least one of an oxide, nitride, and carbide layer.

In exemplary embodiments of the present invention, the deposition method may be a MOCVD, a chemical vapor deposition (CVD), an atomic layer deposition (ALD), or other similar deposition methods.

In exemplary embodiments of the present invention, forming the ferroelectric layer, which may utilize an MOCVD, may comprise receiving the substrate on a susceptor; heating the substrate; spraying the metal organic precursor gas, which may be in a heated state, into the process chamber through the first jet element of the showerhead; and spraying the oxidizer gas, which in a heated state, into the process chamber through the second jet element of the showerhead.

In exemplary embodiments of the present invention, the ferroelectric layer may comprise any one selected from the group including PZT, SBT, BLT, or BST ferroelectric layer or a doped PZT, SBT, BLT, BST, metal oxide, and the like. In exemplary embodiments of the present invention, the ferroelectric layer is substantially (111) oriented PZT.

In exemplary embodiments of the present invention, the impurity may comprise any one selected from the group including Ca, Na, Mn, Bi, SiO, and the like, and the metal oxide may comprise any one selected from the group including TiOx, TaOx, AlOx, HfOx, and the like. The oxidizer gas may include any one selected from the group including $O_2$, $O_3$, $NO_2$, $N_2O$, and the like.

The reaction temperature of the metal organic chemical vapor deposition (MOCVD) may be less than or equal to 580° C. (for example, between 540° C. and 560° C.).

The metal organic precursor gas may include lead (Pb) or compounds thereof, zirconium (Zr) or compounds thereof and titanium (Ti) or compounds thereof, and the oxidizer gas may be an oxygen gas ($O_2$).

The oxidizer gas may be heated to at least the temperature of the heated metal organic precursor gas flowing and sprayed into the process chamber.

A partial pressure of the oxidizer gas may be greater than two times a partial pressure of the carrier gas (for example, 2.5 to 3.5 times a partial pressure of the carrier gas).

The orientation-enhancing layer may be a (111) oriented TiAlN layer, and the ferroelectric layer may be a (111) oriented columnar structure PZT layer.

In an exemplary embodiment of the present invention, a method of forming a ferroelectric capacitor may comprise forming a lower electrode orientation-enhancing layer which may be oriented toward a specific plane; forming a plane oriented ferroelectric layer on the lower electrode layer through a MOCVD reaction between a heated metal organic precursor gas and a heated oxidizer gas; forming an upper electrode layer on the ferroelectric layer; and patterning the upper electrode layer, the ferroelectric layer and the lower electrode layer.

The step of forming the ferroelectric layer may utilize an MOCVD. The MOCVD may include a process chamber for applying an MOCVD process to a substrate; a susceptor for heating the substrate to a reaction temperature of MOCVD; a showerhead; a first gas inflow device which may include a vaporizer and may guide the metal organic precursor gas to a first jet element; and a second gas inflow device which may include a heater and may guide the oxidizer gas to a second jet element.

The showerhead may comprise: the first jet element which may spray the metal organic precursor gas and the carrier gas, which may be in a heated state, into the process chamber; and the second jet element which may spray the oxidizer gas, which may be in a heated state, into the process chamber. The showerhead may suppress a pre-mixing of the heated metal organic precursor gas and the heated oxidizer gas before passing through the first and second jet elements.

The step of forming the ferroelectric layer using the MOCVD, may include: receiving the substrate on a susceptor; heating the substrate; spraying the heated metal organic precursor gas into the process chamber through the first jet element of the showerhead; and spraying the heated oxidizer gas into the process chamber through the second jet element of the showerhead.

In exemplary embodiments of the ferroelectric layer may comprise any one selected from the group consisting of PZT, SBT ($SrBiTiO_3$), BLT ($BiLaTiO_3$), BST ($BiSrTiO_x$), impurity-doped PZT, metal oxide, and the like.

In another exemplary embodiment of the present invention, a method of forming a ferroelectric memory device may comprise providing a substrate; forming a transistor on the substrate; forming a first interlayer insulating layer on the substrate; forming a contact pad which may penetrate the first interlayer insulating layer; forming a second interlayer insulting layer on the first interlayer insulating layer; forming a bit line on the second interlayer insulating layer; forming a third interlayer insulating layer on the second interlayer insulating layer; forming a contact plug which may penetrate the second and/or third interlayer insulating layers; forming a lower electrode layer which may include an orientation-enhancing layer, which may be oriented toward a plane; forming the plane oriented ferroelectric layer on the lower electrode layer through an MOCVD reaction between the heated metal organic precursor gas and the heated oxidizer gas; forming an upper electrode layer on the ferroelectric layer; and patterning the upper electrode layer, the ferroelectric layer and the lower electrode layer to form a ferroelectric capacitor.

Exemplary embodiments of the present invention may comprise forming a local plate line electrically which may be connected to two adjoining upper electrodes, and forming a main plate line electrically which may be connected to the local plate line.

An encapsulating barrier layer (EBL) and/or a hydrogen barrier layer (HBL) may be formed on the third interlayer insulating layer including the ferroelectric capacitor.

Exemplary embodiments of the present invention, may further comprise forming a fourth interlayer insulating layer on the third interlayer insulating layer, and forming a local plate line on the fourth interlayer insulating layer, electrically connecting two adjoining upper electrodes; forming a fifth interlayer insulating layer on the fourth interlayer insulating layer; forming a metal interconnection on the fifth interlayer insulating layer; forming a sixth interlayer insulating layer on the fifth interlayer insulating layer; forming a via hole exposing the local plate line; and forming a main plate, electrically connected to the local plate line, in the via hole.

In exemplary embodiments of the present invention, the metal organic chemical vapor deposition (MOCVD) apparatus may form a PZT having a (111) oriented crystal growth, by applying a process at a temperature between 540° C. and 580° C. (for example, at a temperature of 580° C.), and an oxidizer. Ferroelectric capacitors and ferroelectric memory devices may be fabricated to include a ferroelectric layer using the MOCVD.

DETAILED DESCRIPTION OF THE EXEMPLARY EMBODIMENTS OF THE PRESENT INVENTION

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

Figure 1:
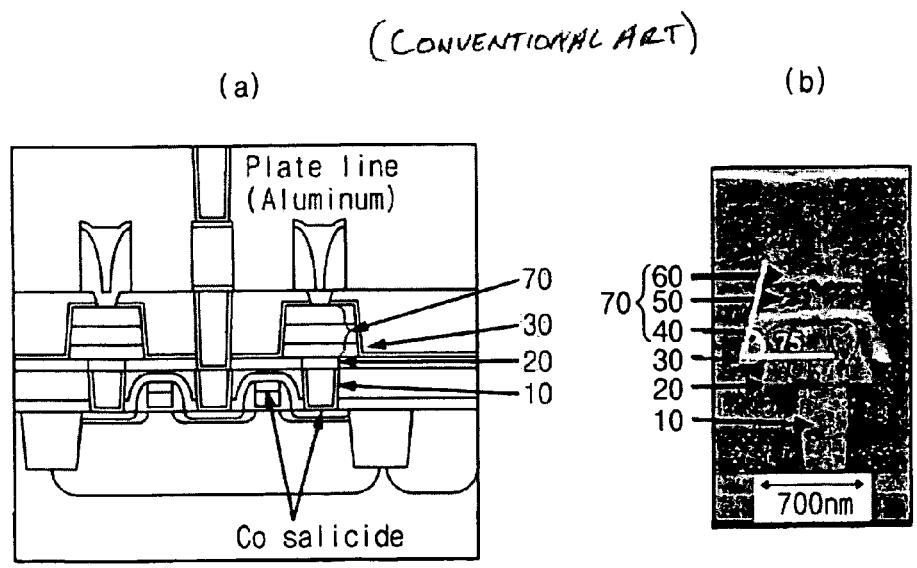
FIG. 1 is a cross-sectional view showing a method of forming a ferroelectric memory device according to the conventional art.
Figure 2:
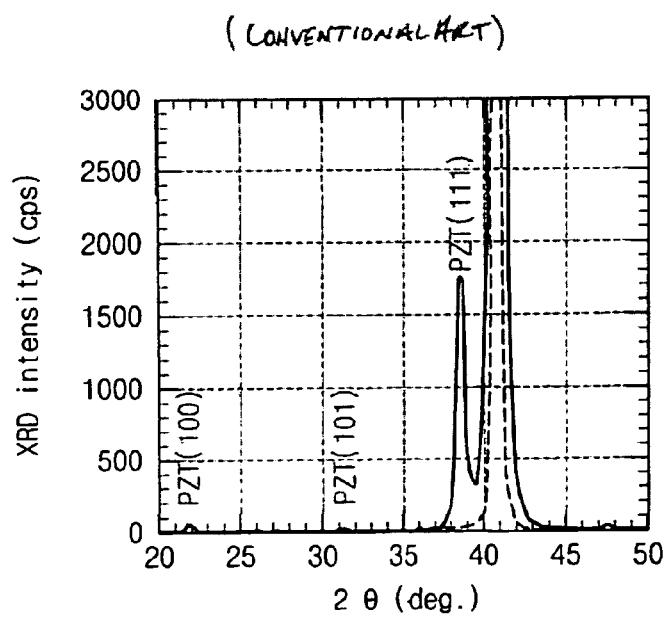
FIG. 2 is a graph showing a PZT crystal characteristic of a ferroelectric memory device according to the conventional art.
Figure 3:
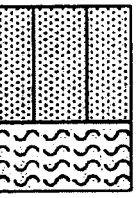
FIG. 3 is a table showing a PZT crystalline structure of a ferroelectric memory device according to the conventional art.
Figure 4:
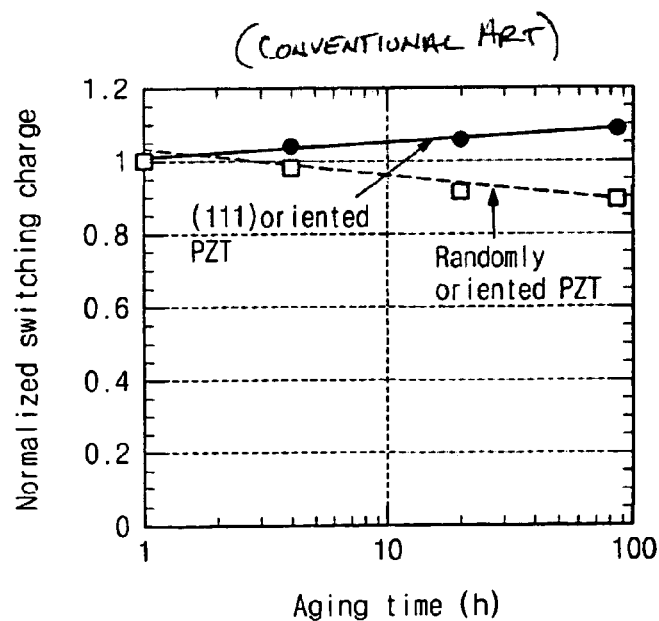
FIG. 4 is a graph showing a retention characteristic of a ferroelectric memory device according to the conventional art.
Figure 5:
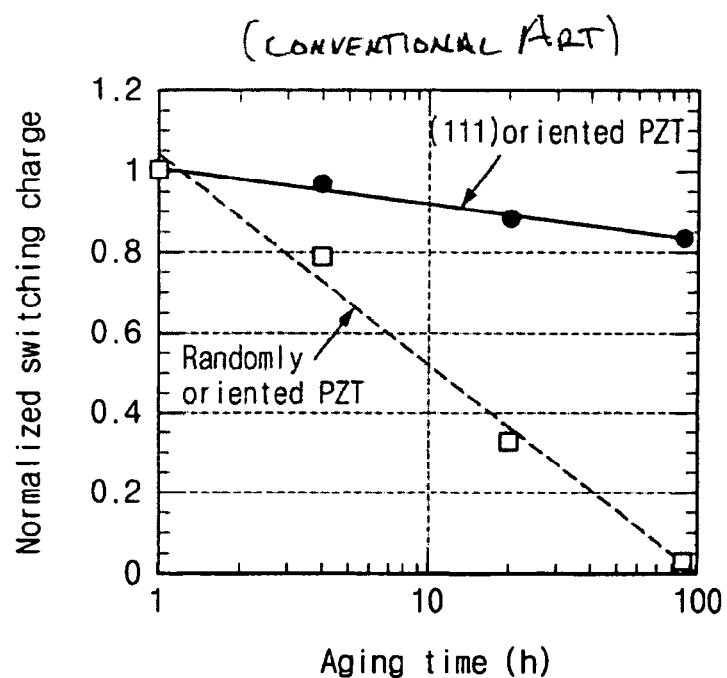
FIG. 5 is a graph showing an imprint characteristic of a ferroelectric memory device according to the conventional art.
Figure 6:
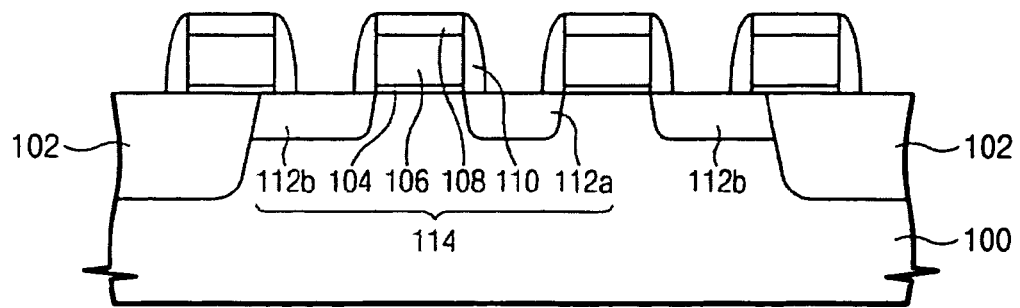
FIGS. 6 through 13 are cross-sectional views showing examples of methods of a ferroelectric capacitor and a ferroelectric memory device according to exemplary embodiments of the present invention during intermediate fabrication steps.

In an exemplary embodiment of the present invention, referring to FIG. 6, a method of fabricating a ferroelectric memory device may include preparing a substrate 100 (for example, an integrated circuit substrate) which may comprise semiconductor elements such as silicon (Si), and the like. A field isolation layer 102 may be formed in a region of the substrate 100 and may define active regions where various elements (e.g., a transistor) may be formed. Techniques of forming the field isolation layer 102 may include a local oxidation of silicon (LOCOS) technique and/or a shallow trench isolation (STI) technique.

A transistor 114, which may be a word line, may be formed on the active region in the substrate 100 which may be defined by the field isolation layer 102. The transistor 104 may be defined by forming a gate insulating layer 104, a gate electrode 106, a hard mask layer 108, gate spacers 110, a source region 112a and/or a drain region 112b.

Figure 7:
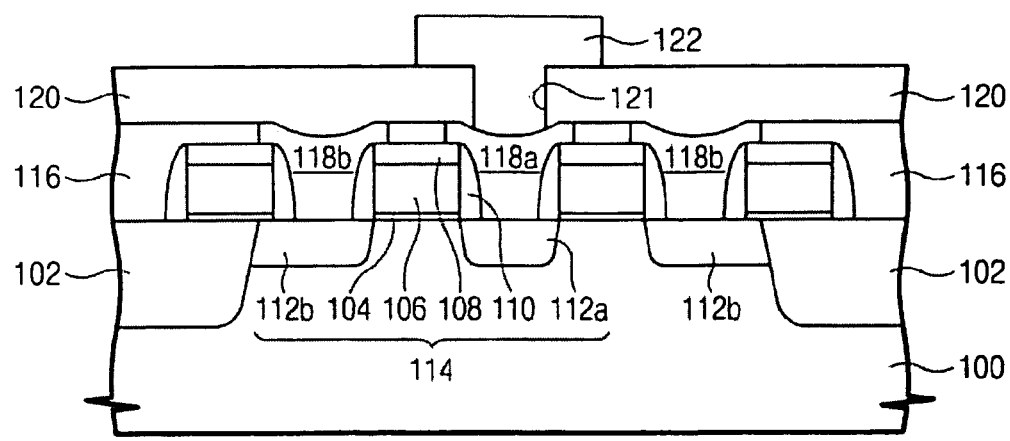

Referring to FIG. 7, a first interlayer insulating layer 116 may be formed on the substrate 100 and may include the transistor 114. The first interlayer insulating layer 116 may be formed of insulating materials, such as a silicon oxide, and the like, and may cover the entire transistor 114 through a deposition (for example, a conventional chemical vapor deposition (CVD)).

The first interlayer insulating layer may be selectively removed and conductive materials such as polysilicon, and the like, may be deposited and/or buried to form a first contact pad 118a which may be electrically connected to the source region 112a, and a second contact pad 118b which may be electrically connected to the drain region 112b.

A second interlayer insulating layer 120 may be formed on the first interlayer insulating layer 116. The second interlayer insulating layer 120 may be formed by depositing insulating materials such as a silicon oxide layer, or the like, through a deposition process (for example, a conventional CVD process) similar to that of the first interlayer insulating layer 116.

A bit line 122, which may serve as a data line of ferroelectric memory devices, may be formed to penetrate the second interlayer insulating layer 120 and may electrically connect the source region 112a of the substrate 100. The bit line 122 may be formed by selectively removing the second interlayer insulating layer 120 and may expose a first contact pad 118a electrically connected to the source region 112a of the substrate 100 through an anisotropic etching method (for example, a plasma dry etching method). A first contact hole 121, which may penetrate the second interlayer insulating layer 120, may be formed and the first contact hole 121 may be filled with conductive material such as metal, polysilicon, tungsten, etc. The conductive material may be patterned to form a bit line 122.

Figure 8:
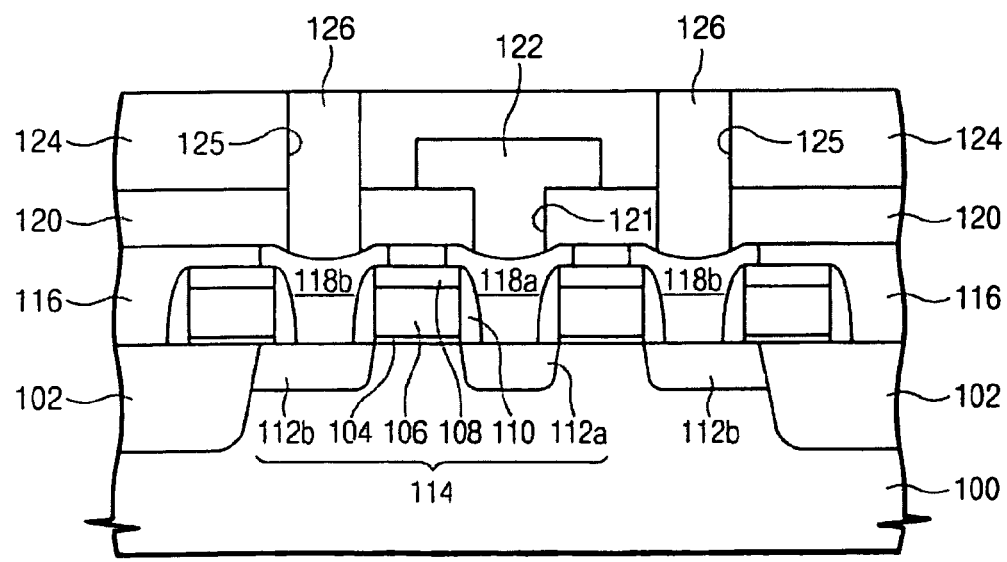

Referring to FIG. 8, a third interlayer insulating layer 124 may be formed on the second interlayer insulating layer 122 with the bit line 122. The third interlayer insulating layer 124 may be formed and may cover the entire bit line 122 through a deposition (for example, a conventional CVD) process in a manner similar to that of the first and second interlayer insulating layers 116 and 120.

The third and second interlayer insulating layers 124 and 120 may be selectively removed and may expose a second contact pad 118b which may be electrically connected to the drain region 112b of the substrate 100 through an anisotropic etching method. A second contact hole 125 may be formed, may penetrate the second and/or third interlayer insulating layers 124 and 120, and may selectively remove a portion thereof. The second contact hole 122 may be filled with conductive material such as, polysilicon, tungsten, etc. The conductive material may be patterned to form a contact plug 126 electrically connected to a drain region 112b and a lower electrode of a capacitor.

Figure 9:
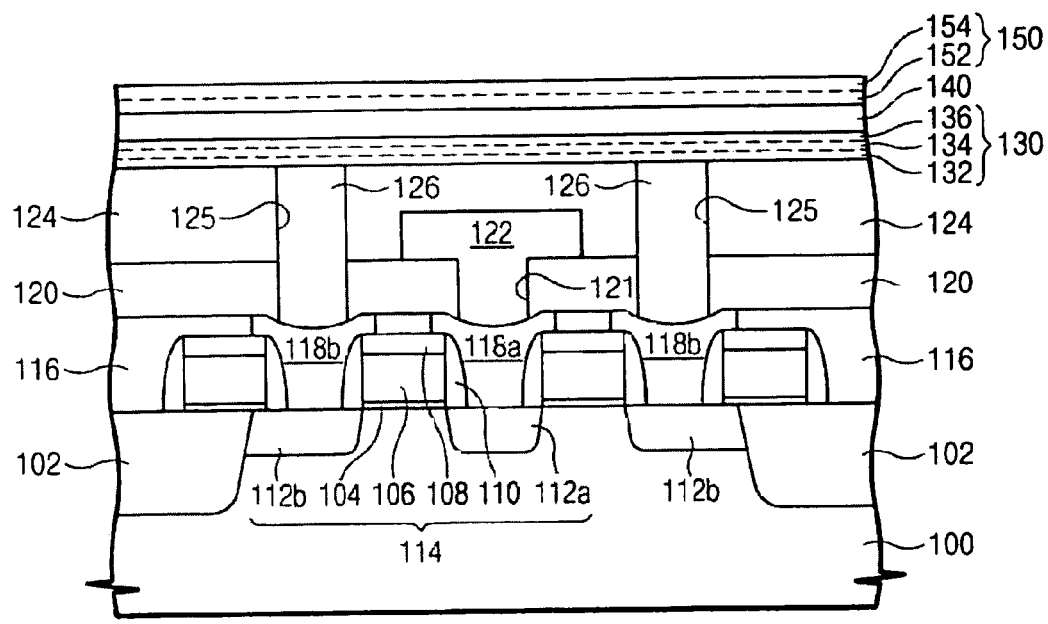

In another exemplary embodiment of the present invention, referring to FIG. 9, a ferroelectric capacitor (referring to 200 of FIG. 10) may be formed on the third insulating interlayer 124.

A lower electrode layer 130 may be formed on the third interlayer insulating layer 124 and may include the contact plug 126. The lower electrode layer 130 may be formed by depositing iridium (Ir) and may be patterned to form a lower electrode.

A seeding layer may be deposited before the deposition of iridium (Ir) and may orient the Pb(Zr, Ti)O$_3$ or PZT toward any one of the crystalline planes which may improve the characteristics of the capacitor. A lower electrode layer 130 may be formed by stacking (for example, sequentially) a titanium layer 132, a seeding layer 134, and an iridium layer 136. The titanium layer 132 may be in contact (for example, directly) with the contact plug 126, and the seeding layer 134 may be capable of orienting the PZT layer to any one the crystalline planes. The seeding layer 134 may be created using TiAlN and may crystallize PZT into a (111) oriented columnar structure.

The lower electrode layer 130 may be formed of a titanium (Ti) layer 132, which may be 5 nm to 10 nm, a titanium aluminum nitride (TiAlN) layer 134, which may be 10 nm to 30 nm, and an iridium (Ir) layer 136, which may be 50 nm to 150 nm. The titanium (Ti) layer 132, the titanium aluminum nitride (TiAlN) layer 134, and the iridium (Ir) layer 136 may be stacked.

A ferroelectric layer 140 may be formed on the lower electrode layer 130 and may be formed of Pb(Zr, Ti)O$_3$ (i.e., PZT). The deposition of the PZT layer 140 may utilize a metal organic chemical vapor deposition (MOCVD) apparatus, and may crystallize the PZT into a (111) oriented structure.

Other apparatuses and methods and variants thereof in accordance with other exemplary embodiments of the present invention may be found in U.S. application Ser. No. not yet assigned (Attorney Docket No. 8947-000072/US) to Moon-Sook Lee and Byoung-Jae Bae entitled "Method And Apparatus For Forming A Ferroelectric Layer" filed concurrently herewith, the entire contents of which are hereby incorporated by reference.

Figure 14:
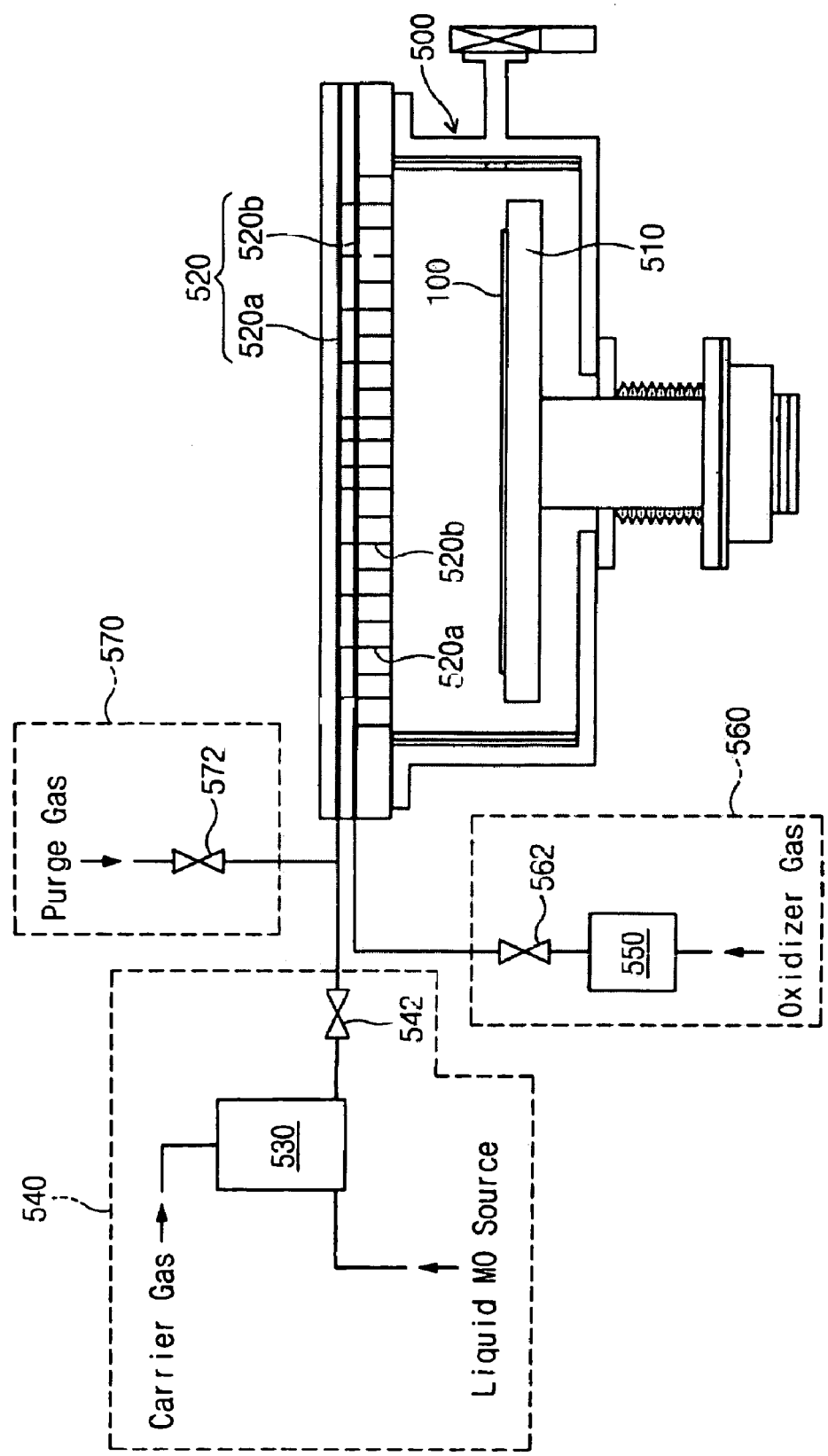
FIG. 14 is a cross-sectional view showing an example of a metal organic chemical vapor deposition (MOCVD) apparatus according to an exemplary embodiment of the present invention.

In another exemplary embodiment of the present invention, referring to FIG. 14, the MOCVD may include at least a process chamber 500, a susceptor 510, a showerhead 520, a first gas inflow device 540 which may include a vaporizer 530, and a second gas inflow device 560 which may include a heater 550. The susceptor 510, on which the substrate 100 may be mounted, for heating the substrate 100 may be disposed at a portion (for example, a bottom portion) within the process chamber 500 in which MOCVD process may be performed. The showerhead 520, which may be positioned opposite the susceptor 510, may be installed at a portion (for example, a top portion) within the process chamber 500. The showerhead 520 may process (for example, downwardly process) gasses into the process chamber 500.

The showerhead 520 may be a dual structure and may comprise a first jet portion 520a and a second jet portion 520b which may spray each of the process gases, respectively. The first jet portion 520a may comprise a plurality of jet nozzles 520a' and the second jet portion 520b may comprise a plurality of jet nozzles 520b'. The first and second jet nozzles 520a' and 520b' may be arranged (for example, alternately) for a more uniform MOCVD reaction.

In another exemplary embodiment of the present invention, the MOCVD process may utilize at least a metal organic precursor gas, a carrier gas and an oxidizer gas. The metal organic precursor gas and a carrier gas may be guided to the substrate 100 in the process chamber 500 through a plurality of jet nozzles 520a' of the first jet portion 520a. The oxidizer gas may be guided to the substrate 100 through a plurality of jet nozzles 520b' of the second jet portion 520b. The metal organic precursor gas and the oxidizer gas, which may flow into the process chamber 500, may react to each other and may deposit a ferroelectric layer on the substrate 100.

The metal organic precursor gas and the carrier gas may flow into the first jet portion 520a from the first gas inflow device 540, which may include a vaporizer 530. The metal organic precursor gas may include lead (Pb) or compounds thereof, zirconium (Zr) or compounds thereof, and titanium (Ti) or compounds thereof. The metal organic precursor gas may be formed by vaporizing a liquid metal organic gas in the vaporizer 530 and heating to a temperature such that the liquid metal organic gas may not be re-liquefied and/or pyrolyzed.

The carrier gas may serve as a carrier for flowing the metal organic precursor gas into the process chamber 500, and an inert gas such as argon, nitrogen, helium, and the like may be used as the carrier gas.

An oxidizer gas (for example, oxygen (O$_2$) gas) may flow into the second jet portion 52b from the second gas inflow device 560 and may include a heater 550. The oxidizer gas may pass through the heater 550, may flow into the second jet portion 520b, and may be heated to a specific temperature, for example, the temperature of the metal organic precursor gas in a heated state flowing into the process chamber 500. The metal organic precursor gas and the oxidizer gas in a heated state may flow into the process chamber 500. The oxidizer gas may be one of O$_3$, N$_2$O, NO$_2$ and the like.

Figure 15:
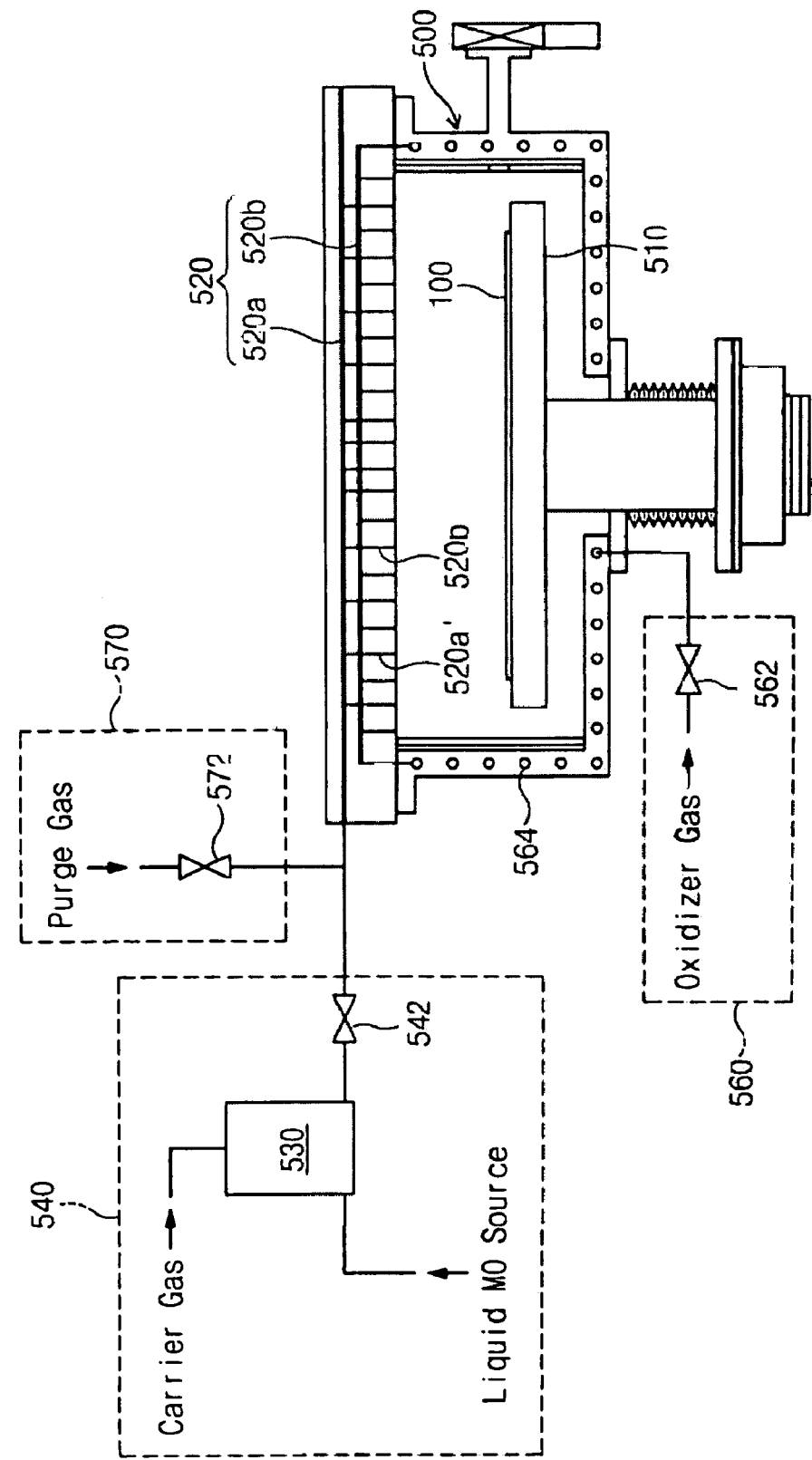
FIG. 15 is a cross-sectional view showing an example of an MOCVD according to an exemplary embodiment of the present invention.

Referring to FIG. 15, the oxidizer gas (for example, O$_2$) may stream into the process chamber 500 through a coil-shaped heater 564 surrounding the susceptor 510. The oxidizer gas may pass through the coil-shaped heater 564, and may be heated to a temperature by heat transferred from the susceptor 510.

In another exemplary embodiment of the present invention, the MOCVD may include a third gas inflow device 570 for performing a purging operation with a purge gas. The valves 542, 562, and 572 may control flows of respective process gases, such that the ferroelectric layer may be deposited using the MOCVD, and a substrate 100 (for example, an integrated circuit substrate) may be placed on the susceptor 510 in the process chamber 500. The susceptor 510 may be heated to approximately 600° C. and the substrate 100 may be heated to a temperature less than 600° C. by heat transfer.

A metal organic precursor gas may be sprayed into the process chamber 500 and may deposit the ferroelectric layer on the substrate 100. The metal organic precursor gas, which may be heated such that it may not be re-liquefied or pyrolyzed, may be sprayed through the first jet portion 520a of the showerhead 520 into the process chamber 500. The carrier gas may convey the metal organic precursor gas into the process chamber 500. The oxidizer gas in a heated state may be sprayed through a second jet portion 520b of the showerhead 520 into the process chamber 500.

Thermal disturbance between the metal organic precursor gas and the oxidizer gas may be reduced and/or a chemical vapor reaction for forming the ferroelectric layer may be activated because the metal organic precursor gas and the oxidizer gas may be preheated and not pre-mixed.

The oxygen gas and the oxidizer may be supplied when the partial pressure of the oxygen gas may be approximately 2 times (for example, 2.5 to 3.5 times) greater than the oxidizer gas. Deposition of the ferroelectric layer may be improved when the partial pressure of the oxidizer gas (for example, oxygen gas) may be increased.

The ferroelectric layer may be deposited using the above MOCVD and may not utilize a process temperature of 620° C. The PZT layer (i.e., the ferroelectric layer) may be (111) oriented at a temperature of less than or equal to 580° C., e.g., between 540° C. and 560° C.

Other apparatuses and variants thereof in accordance with an exemplary embodiments of the present invention, which may be used to perform the various deposition methods in accordance with exemplary embodiments of the present invention may be found in U.S. application Ser. No. 10/784,772 to Moon-Sook Lee and Byoung-Jae Bae entitled "Apparatus for Fabricating Semiconductor Devices, Heating Arrangement, Shower Head Arrangement, Method of Reducing Thermal Disturbance During Fabrication Of A Semiconductor Device, And Method OF Exchanging Heat During Fabrication Of A Semiconductor Device" filed on Feb. 24, 2003, the entire contents of which are hereby incorporated by reference.

Figure 16:
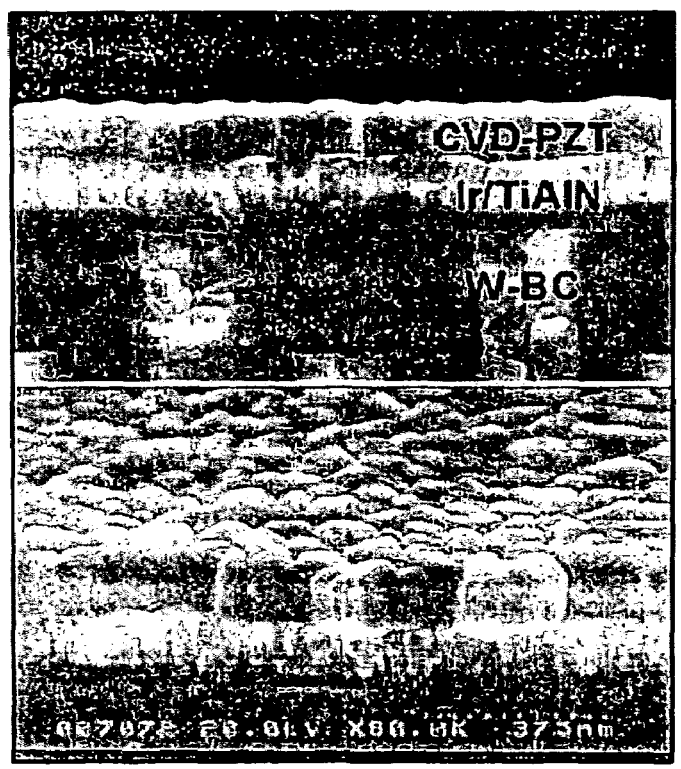
FIG. 16 is a cross-sectional SEM photograph showing an example of a ferroelectric capacitor according to another exemplary embodiment of the present invention.

In exemplary embodiments of the present invention, referring to FIG. 16, the CVD-PZT ferroelectric layer, which may be deposited, using the MOCVD process, on the iridium (Ir) lower electrode including a TiAlN orientation-enhancing layer, may have a (111) oriented columnar structure.

Figure 17:
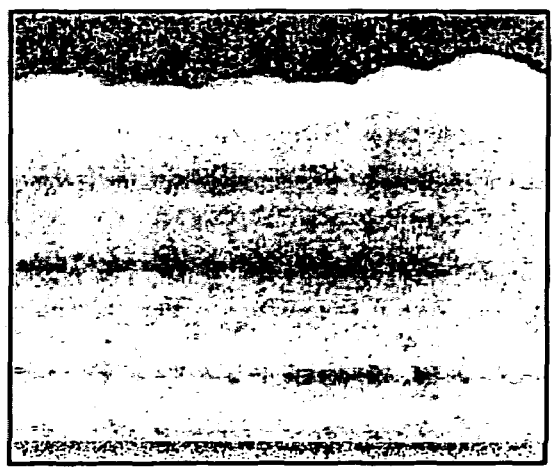
FIG. 17 is a SEM photograph showing an example of a PZT ferroelectric layer according to another exemplary embodiment of the present invention.

FIG. 17 illustrates an example of an extended CVD-PZT ferroelectric layer of FIG. 16 which may have the (111) oriented columnar structure and a top surface of the CVD-PZT layer may be even with the columnar structure.

Figure 18:
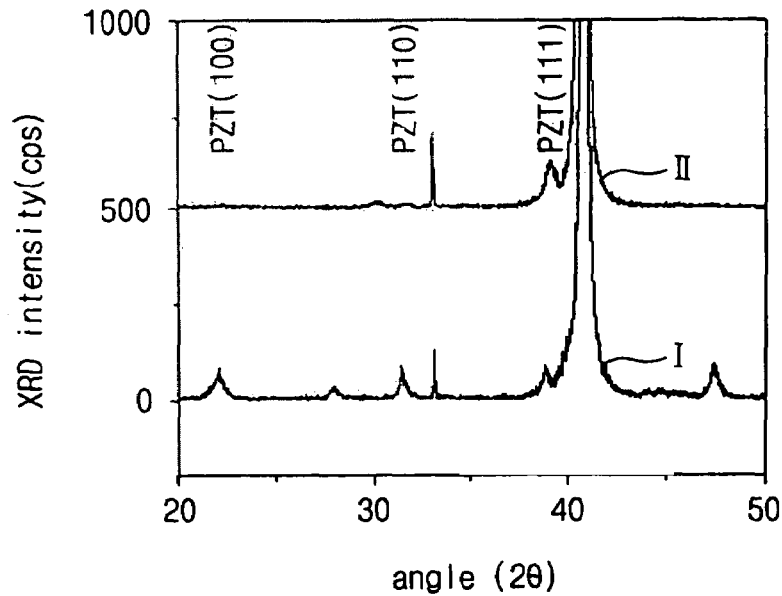
FIGS. 18 and 19 are graphs showing an example of a (111) an orientation of the PZT ferroelectric layer according to exemplary embodiments of the present invention.

FIG. 18 illustrates a crystalline pattern of PZT (I) in cold oxygen and over 600° C. according to the conventional art, and a crystalline pattern of PZT (II) at a temperature less than 580° C. (for example, between 540° C. and 560° C.) in oxygen at a higher temperature according to exemplary embodiments of the present invention. The (100), (110), and (111) oriented PZTs of the conventional art may be similar and the (111) oriented PZT may not exist because the randomly oriented PZT may be grown.

Figure 19:
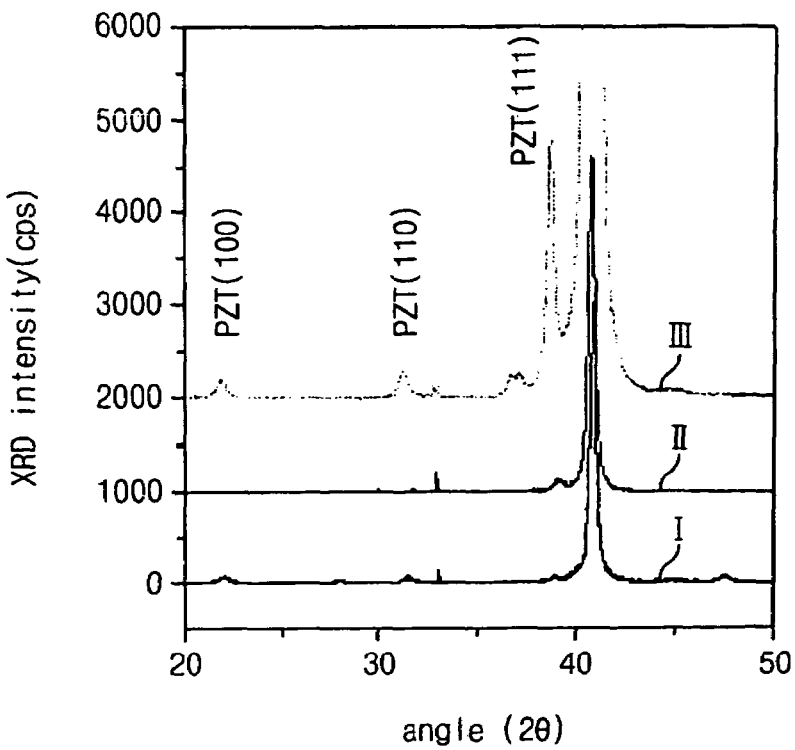

In exemplary embodiments of the present invention, referring to FIG. 19, crystalline characteristics of the ferroelectric layer of crystalline pattern (III) of the PZT, and the crystalline patterns I and II of FIG. 18, may be affected when a TiAlN layer (for example, as an orientation-enhancing layer) may be deposited under the iridium lower electrode.

Referring to FIG. 19, the orientation-enhancing layer may further deposited and the PZT may have a larger (111) orientation compared to (100) and (110) orientations. A peak of (111) PZT intensity may increase due to the orientation-enhancing layer and the crystalline characteristics of the (111) PZT may be improved.

In another exemplary embodiment of the present invention, referring to FIG. 9 again, the PZT ferroelectric layer 140 may be formed, and an upper electrode layer 150 may be formed on the ferroelectric layer 140. Any one of the SBT ($SrBiTiO_3$), BLT ($BiLaTiO_3$), BST ($BiSrTiO_x$), and the like; PZT doped with any of Ca, La, Mn, Bi, $SiO_x$, and the like; and metal oxide such as $TiO_x$, $TaO_x$, $AlO_x$, $HfO_x$, etc. may be used to form the ferroelectric layer 140. The upper electrode layer 150 may have stacked structure and may include an iridium oxide (e.g., iridium dioxide ($IrO_2$) layer 152, which may provide the ferroelectric layer 140 with oxygen and/or improve fatigue characteristics of ferroelectric memory devices, may be deposited on the ferroelectric layer 140. The iridium oxide layer 152 may be mechanically weak, and an iridium layer 156 may be deposited on the iridium oxide layer 152 to compensate for a lack of mechanical strength thereof.

Figure 10:
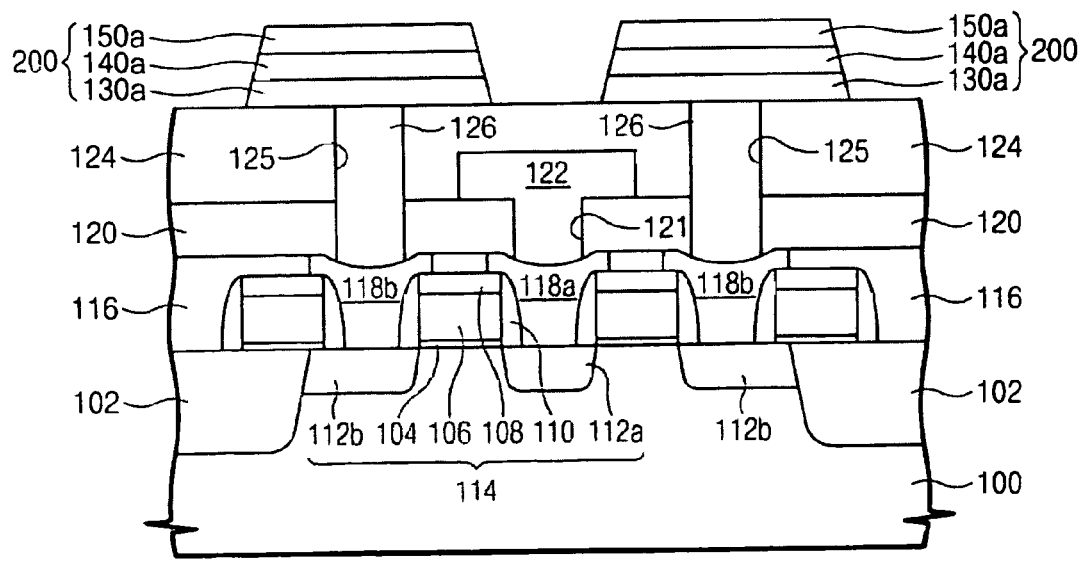

Referring to FIG. 10, the upper electrode layer 150, the ferroelectric layer 140, and the lower electrode layer 130 may be patterned and etched using a single mask or multiple masks to form a plurality of ferroelectric capacitors 200. Each of the ferroelectric capacitors 200 may include a lower electrode 130a, a ferroelectric layer 140a and an upper electrode 150a which may be stacked (for example, sequentially). The ferroelectric capacitor 200 may be electrically connected to the drain region 112b.

Figure 11:
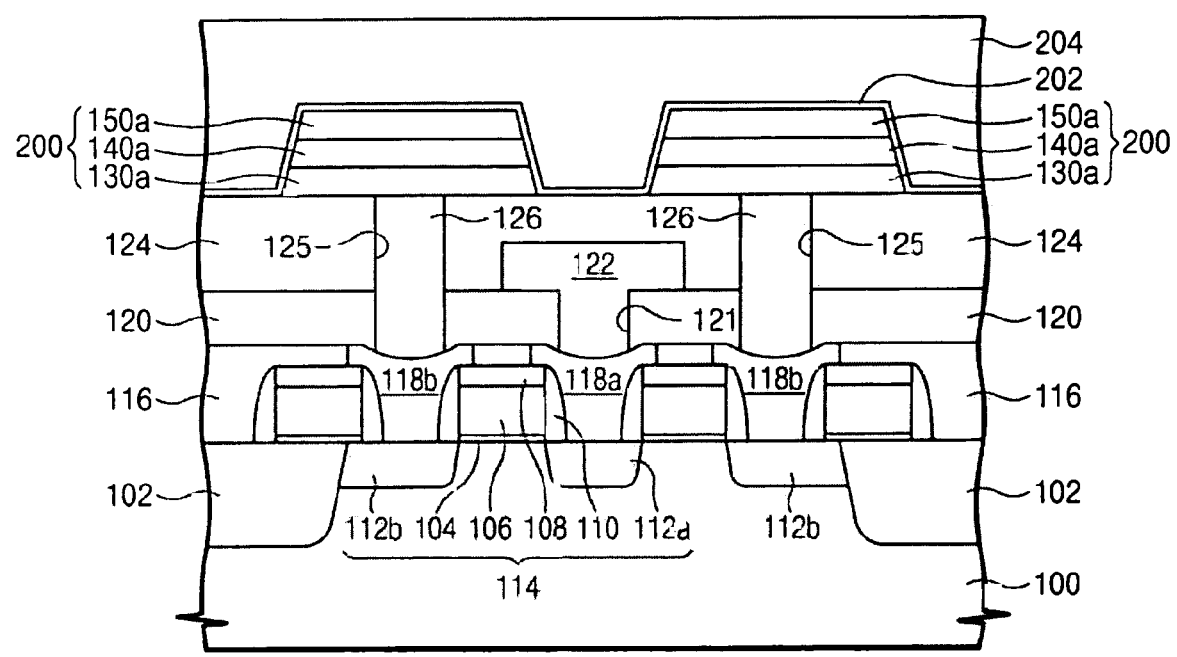

Referring to FIG. 11, a fourth interlayer insulating layer 204 may be formed on a surface (for example, the entire surface) of the third interlayer insulation layer 124 of the ferroelectric capacitor 200. The fourth interlayer insulating layer 204 may be silicon oxide, etc. and may be deposited using a deposition process (for example, a chemical vapor deposition (CVD) process).

An encapsulating barrier layer (EBL) and/or a hydrogen barrier layer (HBL) 202 may be formed of a titanium oxide ($TiO_2$), an aluminum oxide layer ($Al_2O_3$), a silicon nitride layer ($Si_3N_4$) or any combination thereof, which may suppress a diffusion of hydrogen deteriorating the ferroelectricity of the ferroelectric layer 140a, and a fourth interlayer insulating layer 204 may be formed.

Figure 12:
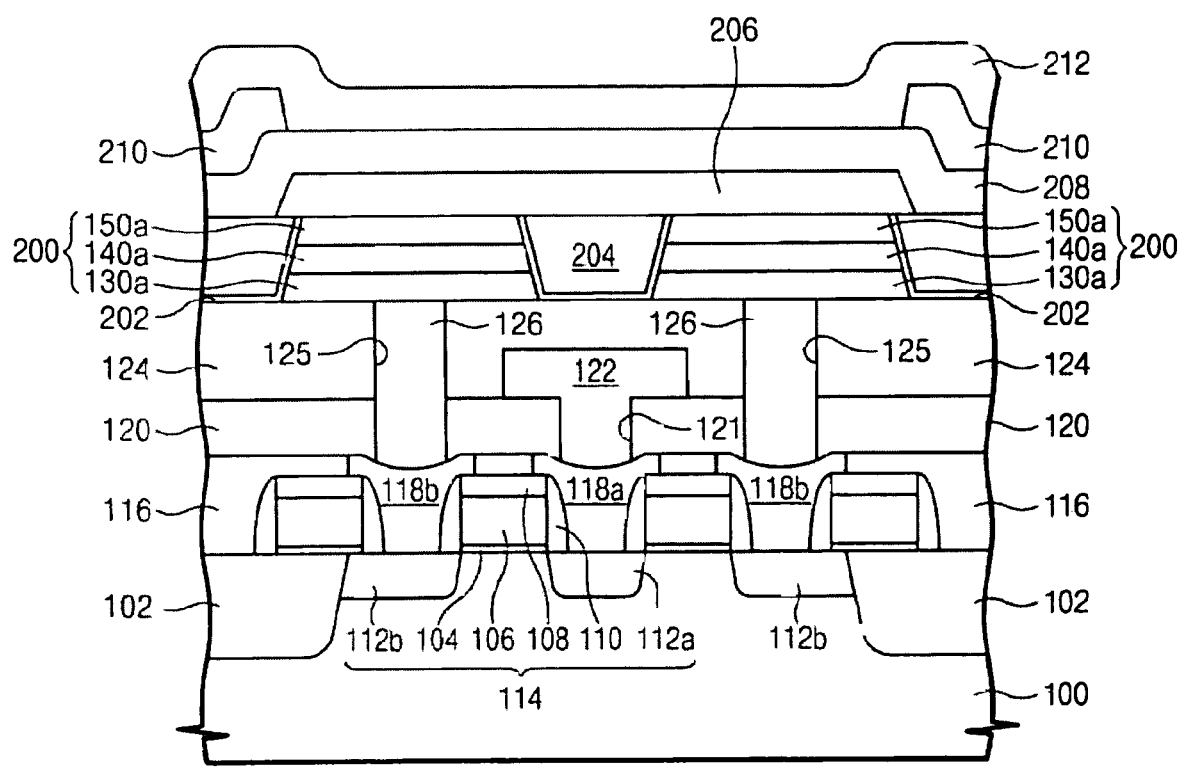

Referring to FIG. 12, the fourth interlayer insulating layer 204 and the encapsulating barrier layer (EBL) and/or hydrogen barrier layer (HBL) 202 may be planarized and may expose the upper electrode 150a of the ferroelectric capacitor 200. The planarization process may be performed using a polishing process (for example, a chemical mechanical polishing process (CMP)) or an etch back process. The encapsulating barrier layer (EBL) and/or hydrogen barrier layer (HBL) 202 may cover the sidewalls of the ferroelectric capacitor 200, i.e., the sidewalls of the ferroelectric layer 140a, such that the probability of an injection of hydrogen atoms into the ferroelectric layer 140 may be reduced. Characteristics of the ferroelectric capacitor 200, for example, a polarity and/or a leakage current, may be degraded when hydrogen atoms may be injected into the ferroelectric layer 140a, and thus, the encapsulating barrier layer (EBL) and/or hydrogen barrier layer (HBL) 202 may improve the characteristics of the ferroelectric capacitor 200.

A local plate line 206 may be formed on the entire surface of the planarized fourth interlayer insulating layer 204. The local plate line 206 may be formed of metal, conductive metal oxide, conductive metal nitride, or any combination thereof. The local plate line 206 may be a titanium aluminum nitride layer (TiAlN), a titanium layer (Ti), a titanium nitride (TiN), an iridium layer (Ir), an iridium oxide layer (IrO2), a platinum layer (Pt), a ruthenium layer (Rt), a ruthenium oxide layer (RuO2), an aluminum layer (Ai) or any combination thereof. The local plate line 206 may be in contact (for example, directly in contact) with two neighboring upper electrodes 150a.

A fifth interlayer insulating layer 208 may be formed on the fourth interlayer insulating layer 204 and may-include the local plate line 206. The fifth interlayer insulating layer 208 may be formed by depositing silicon oxide using a deposition process (for example, a chemical vapor deposition process (CVD)) similar to the forming of the other interlayer insulating layers. A first metal interconnection 210 may be formed by a deposition of metal such as aluminum on a portion of the fifth interlayer insulating layer 208 and a patterning. A silicon oxide layer, for example, may be deposited on the fifth interlayer insulating layer 208 and may include the first interconnection 210 by a deposition process (for example, a conventional chemical vapor deposition (CVD) process) to form a sixth interlayer insulating layer 212.

Figure 13:
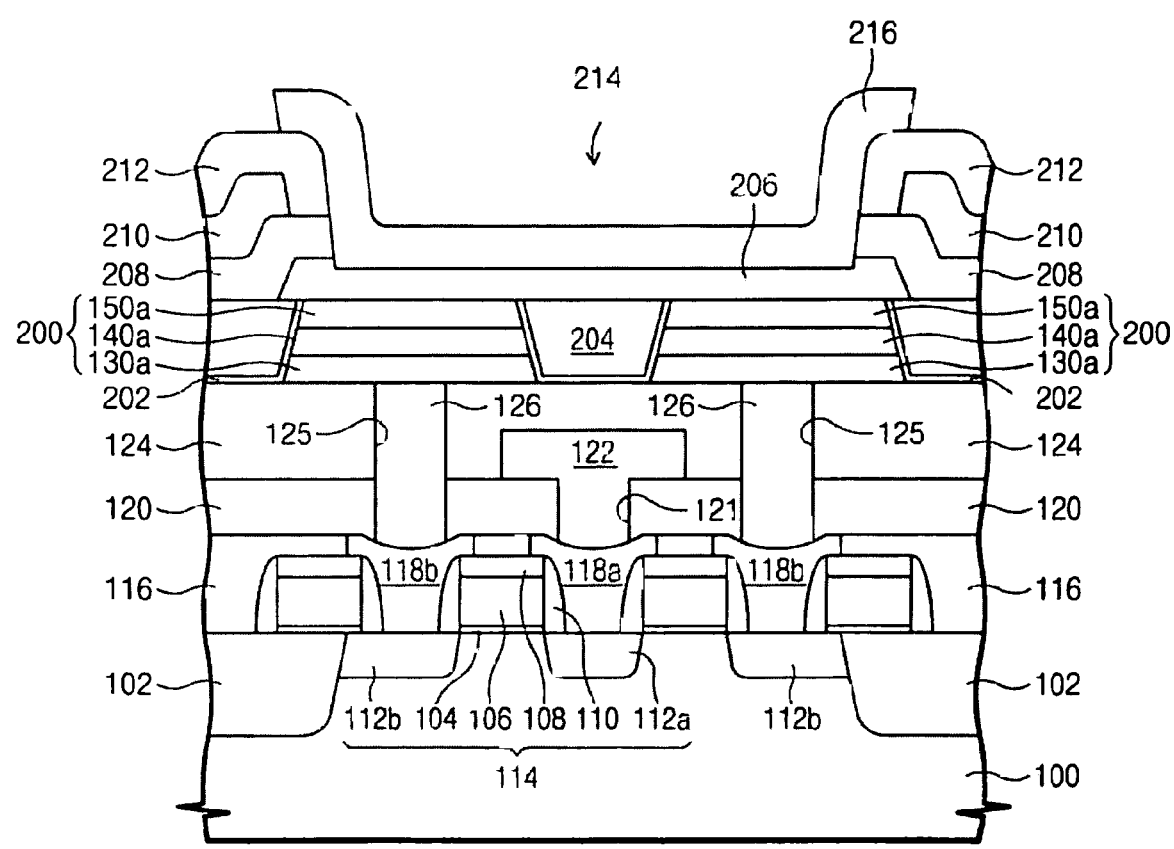

Referring to FIG. 13, the sixth interlayer insulating layer 212 and the fifth interlayer insulating layer 208 may be etched (for example, selectively) and may expose a top surface of the local plate line 206 and form a via hole 214. The local plate line 206 may be etched over when the via hole 214 may be formed.

A main plate line 216 may be formed of aluminum, or any alloy thereof, may be electrically connected to the local plate line 206, and may be exposed at a bottom surface of the via hole 214. The via hole 214 may have a lower aspect ratio, such that the main plate line 216 may have improved step coverage. The main plate line 216 may be electrically connected to at least two neighboring ferroelectric capacitors 200.

In exemplary embodiments of the present invention, the reliability of the ferroelectric memory device having a ferroelectric capacitor may be determined through an imprint test.

Figure 20:
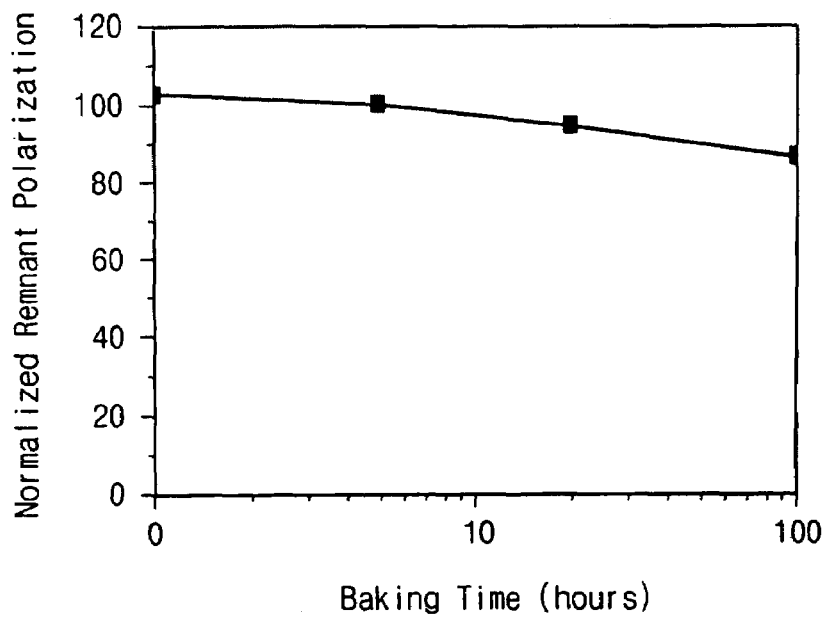
FIG. 20 is a graph showing an example of a characteristic of imprint of the PZT ferroelectric layer according to a exemplary embodiments of the present invention.

FIG. 20 illustrates an imprint test result of the (111) oriented columnar structure PZT in higher temperature Oxygen and when the process conditions may be less than or equal to 580° C., for example between 540° C. and 560° C. The imprint characteristics may refer to the reading ability of the opposite stored state after aging. The remnant polarization may be about 80% when compared with the initial state after aging or baking, and the reliability of ferroelectric capacitor may be improved.

Figure 21:
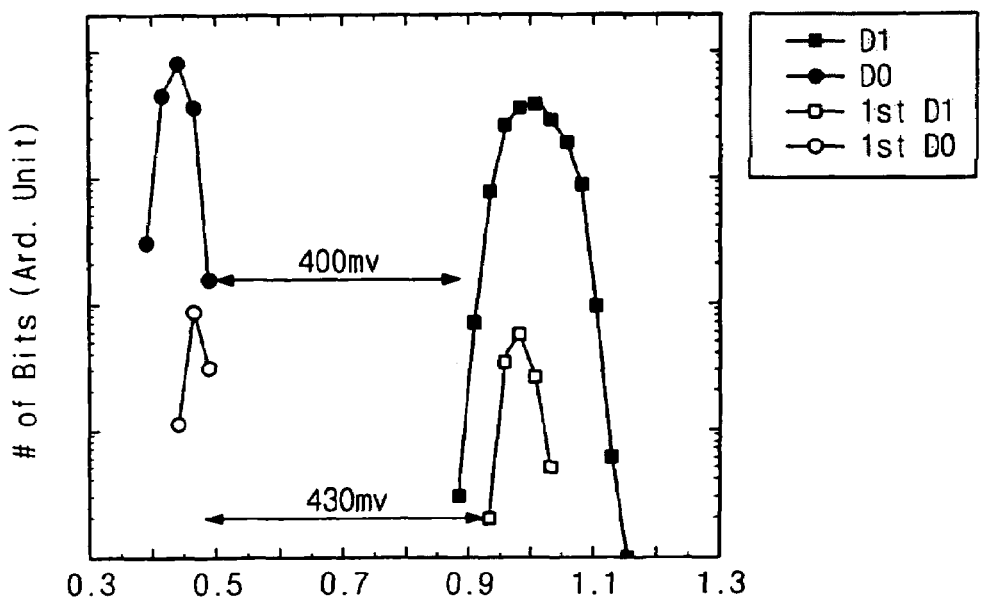
FIG. 21 is a graph showing examples of "D0" and "D1" charge distributions of a ferroelectric memory device according to an exemplary embodiment of the present invention.

Referring to FIG. 20, the polarization may remain approximately 80% even if baking time passes approximately 100 hours. Referring to FIGS. 21 illustrating D0 and D1 charge distributions of the ferroelectric memory device, there may be little difference between $1^{st}$ access case (open circles and squares) and the following cases (closed circles and squares), for example over 10 time cycles.

Figure 22:
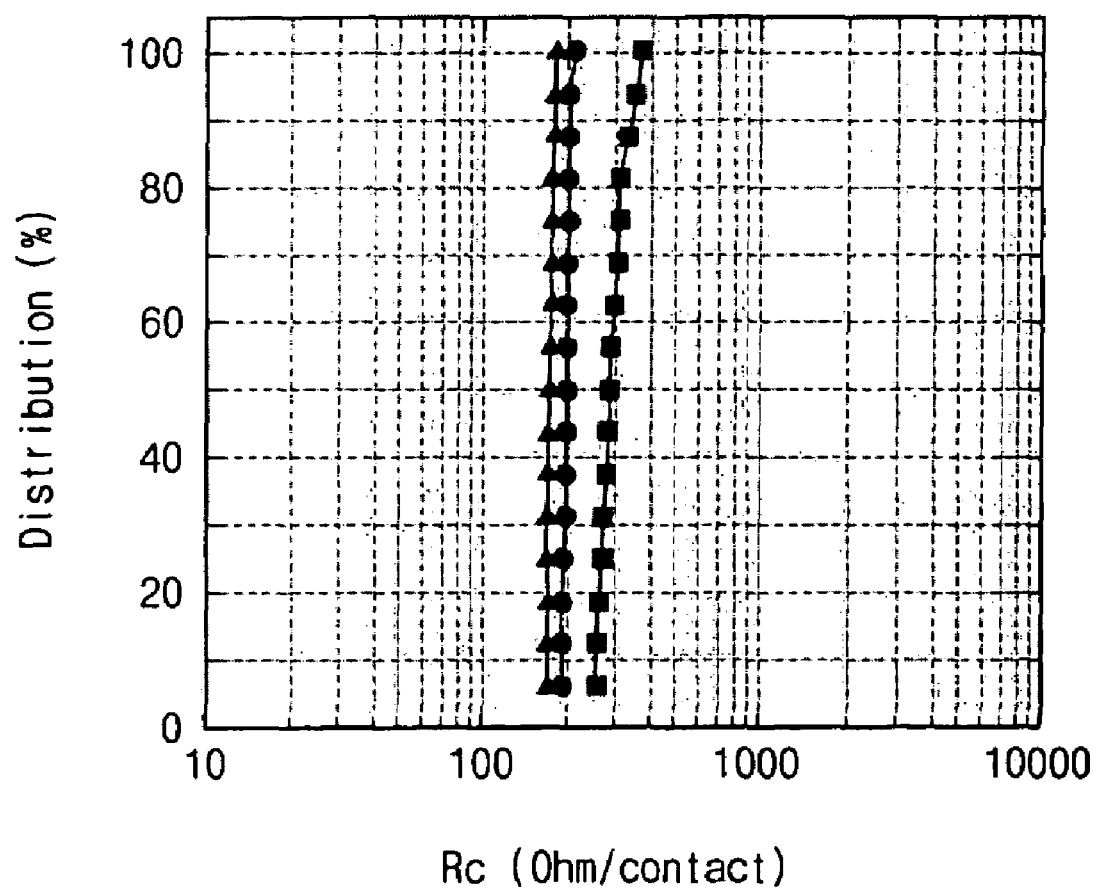
FIG. 22 is a graph showing an example of a distribution of a contact resistance between a contact plug of the ferroelectric memory device and a lower electrode of the capacitor according to an exemplary embodiment of the present invention.

FIG. 22 is a graph illustrating contact resistance between a tungsten contact plug and a lower electrode of capacitor according to an exemplary embodiment of the present invention. The contact plug of the capacitor may have a more stable resistance distribution and may be capable of showing a constant value (ohm/contact).

Thus, an increase in processing time for PZT deposition at around 580° C., Ir/TiAlN layers may reduce oxygen diffusion, thus an oxidized layer between W plug and lower electrode may not be formed, i.e., by depositing PZT at a lower temperature, it may not be necessary to add extra process steps or processes to obtain a more stable contact resistance.

Although the transistor 104 may be defined by forming a gate insulating layer 104, a gate electrode 106, a hard mask layer 108, gate spacers 110, a source region 112a and a drain region 112b, as described by exemplary embodiments of the present invention, it will be understood that the transistor 114 may include additional elements as needed, for example, a lightly doped drain (LDD) or a double gate spacer, as desired by one of ordinary skill in the art. It will also be understood that the transistor may be included in a structure different from the transistor according to exemplary embodiments of the present invention, for example, without the hard mask layer 108 as desired by one of ordinary skill in the art.

While the present invention has been described by way of exemplary embodiments, it is to be understood that the invention is not limited to the disclosed exemplary embodiments. To the contrary, it is intended to cover various modifications and similar arrangements which may be apparent to those skilled in the art. Therefore, the scope of the appended claims, which define the invention, should be accorded the broadest interpretation so as to encompass all such modifications and similar structures.

What is claimed is:

1. A method of forming a ferroelectric capacitor, comprising:
   providing a substrate on a susceptor;
   forming a lower electrode layer including an orientation-enhancing layer on the susceptor;
   providing a heated metal organic precursor gas into the substrate, wherein the metal organic precursor gas is heated through a vaporizer;
   providing a heated oxidizer gas into the substrate, wherein the oxidizer gas passes through a coil-shaped heater surrounding the susceptor and then is heated, separately from the heated metal organic precursor gas, wherein the heated metal organic precursor gas and the heated oxidizer gas are not pre-mixed;
   forming a plane oriented ferroelectric layer on the lower electrode layer by utilizing an MOCVD reaction between the heated metal organic precursor gas and the heated oxidizer gas;
   forming an upper electrode layer on the ferroelectric layer; and
   patterning the upper electrode layer, the ferroelectric layer and the lower electrode layer.

2. The method of claim 1, wherein forming the ferroelectric layer utilizes an MOCVD including,
   a process chamber for applying MOCVD process to a substrate, wherein the process chamber includes the susceptor for heating the substrate to a reaction temperature of MOCVD;
   a showerhead comprising:
     a first jet element for spraying the metal organic precursor gas and the carrier gas in a heated state into the process chamber; and
     a second jet element for spraying the oxidizer gas in a heated state into the process chamber,
   wherein, the showerhead suppresses a pre-mixing of the metal organic precursor gas and the oxidizer gas before passing the first and second jet elements,
   a first gas inflow device including the vaporizer and guiding the metal organic precursor gas to the first jet element; and
   a second gas inflow device including the coil-shaped heater and guiding the oxidizer gas to the second jet element.

3. The method of claim 2, wherein forming the ferroelectric layer by utilizing the MOCVD includes,
   receiving the substrate on the susceptor;
   heating the substrate;
   spraying the metal organic precursor gas in a heated state into the process chamber through the first jet element; and
   spraying an oxidizer gas in a heated state into the process chamber through the second jet element.

4. The method of claim 1, wherein the ferroelectric layer includes any one selected from the group including PZT, SBT, BLT, BST, impurity doped PZT, and metal oxide.

5. The method of claim 4, wherein the impurity includes any one selected from the group including Ca, Na, Mn, Bi, and SiO.

6. The method of claim 4, wherein the metal oxide includes any one selected from the group including of $TiO_x$, $TaO_x$, $AlO_x$, and $HfO_x$.

7. The method of claim 1, wherein the oxidizer gas includes any one selected from the group including $O_2$, $O_3$, $NO_2$, and $N_2O$.

8. The method of claim 1, wherein the reaction temperature of the metal organic chemical vapor deposition (MOCVD) is less than or equal to 580° C.

9. The method of claim 1, wherein the reaction temperature of the metal organic chemical vapor deposition (MOCVD) between 540° C. and 560° C.

10. The method of claim 1, wherein the metal organic precursor gas includes lead (Pb) or compounds thereof, zirconium (Zr) or compounds thereof and titanium (Ti) or compounds thereof, and wherein the oxidizer gas is an oxygen gas ($O_2$).

11. The method of claim 1, wherein the oxidizer gas is heated to at least the temperature of the heated metal organic precursor gas flowing into the process chamber and sprayed into the process chamber.

12. The method of claim 1, wherein a partial pressure of the oxidizer gas is greater than two times a partial pressure of the carrier gas.

13. The method of claim 1, wherein a partial pressure of the oxidizer gas is between 2.5 times and 3.5 times a partial pressure of the carrier gas.

14. The method of claim 1, wherein the orientation-enhancing layer is a (111) oriented TiAlN layer.

15. The method of claim 1, wherein the ferroelectric layer is a (111) oriented columnar structure PZT layer.

16. A method of forming a ferroelectric memory device, including,
 providing a substrate on a susceptor;
 forming a transistor on the substrate;
 forming a first interlayer insulating layer on the substrate;
 forming a contact pad penetrating the first interlayer insulating layer;
 forming a second interlayer insulating layer on the first interlayer insulating layer;
 forming a bit line on the second interlayer insulating layer;
 forming a third interlayer insulating layer on the second interlayer insulating layer;
 forming a contact plug penetrating the second and third interlayer insulating layers;
 forming a lower electrode layer including an orientation-enhancing layer;
 providing a heated metal organic precursor gas into the substrate, wherein the metal organic precursor gas is heated through a vaporizer;
 providing an oxidizer gas into the substrate, wherein the oxidizer gas passes through a coil-shaped heater surrounding the susceptor and then is heated, separately from the heated metal organic precursor gas, wherein the heated metal organic precursor gas and the heated oxidizer gas are not pre-mixed;
 forming a plane oriented ferroelectric layer on the lower electrode layer through a MOCVD reaction between the heated metal organic precursor gas and the heated oxidizer gas;
 forming an upper electrode layer on the ferroelectric layer; and
 patterning the upper electrode layer, the ferroelectric layer and the lower electrode layer to form a ferroelectric capacitor.

17. The method of claim 16, wherein forming the ferroelectric layer utilizes an MOCVD, the MOCVD including,
 a process chamber for applying MOCVD process to a substrate, wherein the process chamber includes the susceptor for heating the substrate to a reaction temperature of MOCVD;
 a showerhead comprising:
  a first jet element for spraying the metal organic precursor gas and a carrier gas in a heated state into the process chamber; and
  a second jet element for spraying the oxidizer gas in a heated state into the process chamber,
  wherein, the showerhead suppresses a pre-mixing of the metal organic precursor gas and the oxidizer gas before passing the first and second jet elements;
 a first gas inflow device including the vaporizer and guiding the metal organic precursor gas to the first jet element; and
 a second gas inflow device including the coil-shaped heater and guiding the oxidizer gas to the second jet element.

18. The method of claim 17, wherein forming the ferroelectric layer by utilizing the MOCVD includes,
 receiving the substrate on the susceptor;
 heating the substrate; and
 spraying the metal organic precursor gas in a heated state into the process chamber through the first jet element, and spraying the oxidizer gas in a heated state into the process chamber through the second jet element.

19. The method of claim 16, wherein the ferroelectric layer includes any one selected from the group including PZT, SBT, BLT, BST, impurity doped PZT, and metal oxide.

20. The method of claim 19, wherein the impurity includes any one selected from the group including Ca, Na, Mn, Bi, and SiO.

21. The method of claim 19, wherein the metal oxide includes any one selected from the group including $TiO_x$, $TaO_x$, $AlO_x$, and $HfO_x$.

22. The method of claim 16, wherein the oxidizer gas includes any one selected from the group including $O_2$, $O_3$, $NO_2$ and $N_2O$.

23. The method of claim 16, wherein the reaction temperature of the metal organic chemical vapor deposition (MOCVD) is lees than or equal to 580° C.

24. The method of claim 16, wherein the reaction temperature of the metal organic chemical vapor deposition (MOCVD) is between 540° C. and 560° C.

25. The method of claim 16, wherein the metal organic precursor gas includes lead (Pb) or compounds thereof, zirconium (Zr), or compounds thereof and titanium (Ti) or compounds thereof, and wherein the oxidizer gas is an oxygen gas ($O_2$).

26. The method of claim 16, wherein the oxidizer gas is heated to at least the temperature of the heated metal organic precursor gas flowing into the process chamber and sprayed into the process chamber.

27. The method of claim 16, wherein a partial pressure of the oxidizer gas is greater than two times a partial pressure of the carrier gas.

28. The method of claim 16, wherein a partial pressure of the oxidizer gas is between 2.5 times and 3.5 times a partial pressure of the carrier gas.

29. The method of claim 16, wherein the orientation-enhancing layer is a (111) oriented TiAlN layer.

30. The method of claim 16, wherein the ferroelectric layer is a (111) oriented columnar structured PZT.

31. The method of claim 16, further including,
 forming a local plate line electrically connected to two adjoining upper electrodes; and
 forming a main plate line electrically connected to the local plate line.

32. The method of claim 16, further including forming a hydrogen barrier layer on the third interlayer insulating layer including the ferroelectric capacitor.

33. The method of claim 16, further including,
 forming a fourth interlayer insulating layer on the third interlayer insulating layer;
 forming a local plate line on the fourth interlayer insulating layer electrically connecting two adjoining upper electrodes;
 forming a fifth interlayer insulating layer on the fourth interlayer insulating layer;
 forming a metal interconnection on the fifth interlayer insulating layer;

forming a sixth interlayer insulating layer on the fifth interlayer insulating layer;

forming a via hole for exposing the local plate line; and forming a main plate in the via hole, the main plate line electrically connected to the local plate line.

34. A method of forming a ferroelectric layer comprising:

receiving a substrate on a susceptor;

heating the substrate;

spraying at least a first metal organic precursor gas into a process chamber through a jet element of a showerhead, wherein the metal organic precursor gas is heated through a vaporizer; and spraying at least a second gas into the process chamber through another jet element, wherein the second gas passes through a coil-shaped heater surrounding the susceptor and then is heated, and the showerhead suppresses a pre-mixing of the first metal organic precursor gas and the second gas.

35. The method of claim 34, wherein the first metal organic precursor gas is in a heated state, and the second gas is an oxidizer gas in a heated state.

36. The method of claim 34, wherein the metal organic precursor gas is lead, zirconium, titanium, or compounds thereof.

37. The method of claim 34, wherein the oxidizer gas is oxygen gas and is heated to at least the temperature of the metal organic precursor gas.

* * * * *